United States Patent [19]

Aoki

[11] 4,160,173
[45] Jul. 3, 1979

[54] LOGIC CIRCUIT WITH TWO PAIRS OF CROSS-COUPLED NAND/NOR GATES

[75] Inventor: Kiyoshi Aoki, Yokohama, Japan

[73] Assignee: Tokyo Shibaura Electric Co., Ltd., Kawasaki, Japan

[21] Appl. No.: 859,130

[22] Filed: Dec. 9, 1977

[30] Foreign Application Priority Data

| Dec. 14, 1976 | [JP] | Japan | 51-150199 |
| Dec. 14, 1976 | [JP] | Japan | 51-150203 |
| Jan. 26, 1977 | [JP] | Japan | 52-6838 |
| Jan. 26, 1977 | [JP] | Japan | 52-6840 |

[51] Int. Cl.$^2$ .................. H03K 3/286; H03K 19/08; H03K 19/20; H03K 21/00
[52] U.S. Cl. ................ 307/289; 307/213; 307/215; 307/225 R; 307/291; 328/39; 357/92
[58] Field of Search .......... 307/203, 213, 215, 220 R, 307/225 R, 289, 291; 357/92; 328/39

[56] References Cited

U.S. PATENT DOCUMENTS

| 2,985,773 | 5/1961 | Dobbie | 307/215 X |
| 3,153,200 | 10/1964 | Wahrman et al. | 307/215 X |
| 3,358,238 | 12/1967 | Shapiro et al. | 307/215 X |
| 3,535,544 | 10/1970 | De Troye | 307/215 |
| 3,571,727 | 3/1971 | Lombardi | 307/215 X |
| 3,970,867 | 7/1976 | Leuschner | 307/225 R |
| 3,993,918 | 11/1976 | Sinclair | 307/225 R X |
| 4,001,611 | 1/1977 | Maruyama et al. | 307/289 X |
| 4,051,389 | 9/1977 | Kaneko et al. | 357/92 X |
| 4,065,680 | 12/1977 | Russell | 307/213 X |

FOREIGN PATENT DOCUMENTS

| 1294469 | 5/1969 | Fed. Rep. of Germany | 307/220 R |
| 2057608 | 6/1971 | Fed. Rep. of Germany | 307/215 |
| 2328992 | 12/1973 | Fed. Rep. of Germany | 307/225 R |
| 49-35030 | 9/1974 | Japan. | |

OTHER PUBLICATIONS

Tucci et al., Digest of Technical Papers IEEE-ISSCC 1976; pp. 66-67 & 233; 2/18/76.

*Primary Examiner*—Larry N. Anagnos
*Attorney, Agent, or Firm*—Frishauf, Holtz, Goodman and Woodward

[57] ABSTRACT

A logic circuit provided with first and second cross-coupled NAND/NOR gates and third and fourth cross-coupled NAND/NOR gates. The second NAND/NOR gate is arranged to have a delay of output variation longer than that of the first NAND/NOR gate. A desired logic input signal is applied to one input of the first NAND/NOR gate. A first clock pulse is applied to the first and second NAND/NOR gates. A second clock pulse of opposite polarity to the first clock is applied to the fourth NAND/NOR gate. The output of the first NAND/NOR gate is coupled with the input of the third NAND/NOR gate.

13 Claims, 20 Drawing Figures

F I G. 11
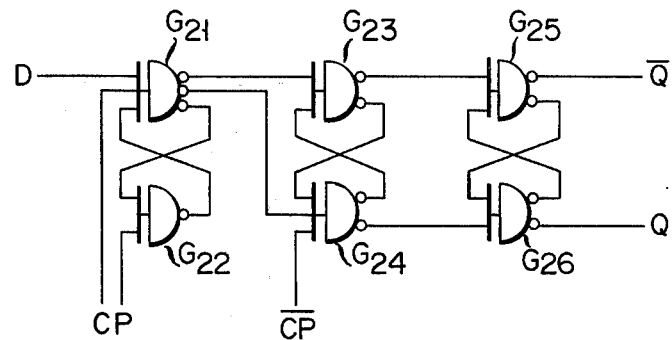
F I G. 12
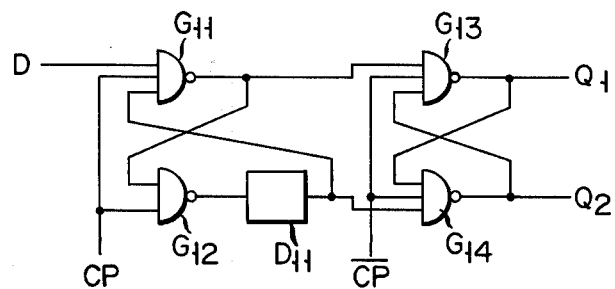
F I G. 13
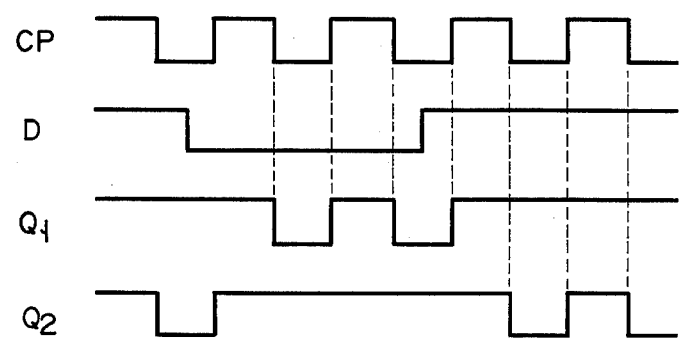

LOGIC CIRCUIT WITH TWO PAIRS OF CROSS-COUPLED NAND/NOR GATES

BACKGROUND OF THE INVENTION

The invention relates to a logic circuit and more particularly to a logic circuit suitable for integrated-injection logic ($I^2L$) gates.

Conventional type-D flip-flop circuits, or binary counters which produce an output having a frequency half that of the clock pulse fed thereto are comprised of four or six logic gates. The minimum possible number of logic gates is desirable to improve integration density and reduce power consumption.

SUMMARY OF THE INVENTION

An object of the invention to provide a logic circuit being capable of executing desired logical functions with the minimum number of logic gates.

Another object of this invention is to provide a logic circuit in which, even when a plurality of such logic circuits are connected in cascade, power dissipation is not correspondingly increased.

According to a broad aspect of this invention, a logic circuit is provided with cross-coupled first and second NAND/NOR gates and cross-coupled third and fourth NAND/NOR gates. The second NAND/NOR gate has its output variation due to an input change delayed with respect to the first NAND/NOR gate. A first clock signal is coupled to the respective inputs of the first and second NAND/NOR gates, a second clock signal substantially in opposite phase to the first clock signal is coupled to an input of at least the fourth NAND/NOR gate, a logic input signal is coupled to an input of the first NAND/NOR gate and the output of the first NAND/NOR gate is coupled to an input of the third NAND/NOR gate.

According to the circuit configuration described above, from the output of third or fourth NAND/NOR gate there is obtained a delayed output signal which corresponds to the logic input signal supplied to the first NAND/NOR gate. To perform a similar operation, the output of the first NAND/NOR gate may be coupled to an input of the fourth NAND/NOR gate, and the third NAND/NOR gate may have its output varied more slowly than the fourth NAND/NOR gate. Alternatively, the output of the second NAND/NOR gate having the output variation delay function may be coupled to an input of the fourth NAND/NOR gate, and the second clock signal may be supplied to the third NAND/NOR gate as well as the fourth NAND/NOR gate.

The logic circuit of the aforementioned structure can function as a binary counter if the output of the fourth NAND/NOR gate is coupled to the input of the first NAND/NOR gate as the logic input.

If cross-coupled fifth and sixth NAND/NOR gates are further provided, whose inputs are coupled to the outputs of the third and fourth NAND/NOR gates, complementary outputs can be obtained from the fifth and sixth NAND/NOR gates.

The logic circuit according to this invention can be preferably constructed by integrated-injection logic ($I^2L$) gates. The output change of an NAND/NOR gate can be delayed by supplying a smaller injection current to the NAND/NOR gate than an injection current to the other NAND/NOR gate.

BRIEF DESCRIPTION OF THE DRAWINGS

FIG. 11 is a circuit diagram of still another embodiment according to the invention;

FIG. 12 is a circuit diagram of yet another embodiment of the logic circuit of the invention;

FIG. 13 is a set of timing charts for illustrating the operation of the logic circuit of FIG. 12;

DETAILED DESCRIPTION OF THE PREFERRED EMBODIMENTS

Figure 1:
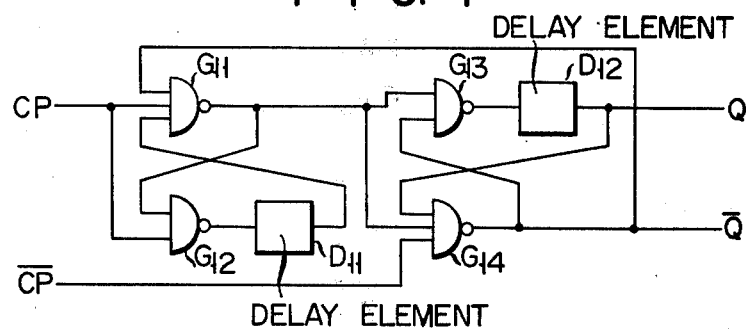
FIG. 1 shows a circuit diagram of an embodiment of a logic circuit of binary counter type according to the invention.

Referring now to FIG. 1, there is shown an embodiment of a logic circuit according to the invention. As shown, the logic circuit is basically comprised of four NAND gates or NOR gates. It is well known that a NAND gate in the positive logic system is expressed by a NOR gate in the negative logic system. In FIG. 1, four NAND gates $G_{11}$, $G_{12}$, $G_{13}$ and $G_{14}$ are used; however, four NOR gates may be employed instead of them.

As shown in FIG. 1, the output of the first NAND gate $G_{11}$ is coupled with an input of the second NAND gate $G_{12}$. The output of the second NAND gate $G_{12}$ is coupled with an input of the first NAND gate $G_{11}$. In this way, both of the NAND gates are cross-coupled. Likewise, the third and fourth NAND gates $G_{13}$ and $G_{14}$ are cross-coupled. A first clock pulse CP is applied to an input of each of the first and second NAND gates $G_{11}$ and $G_{12}$. A second clock pulse $\overline{CP}$ which is an inversion of the first clock pulse $\overline{CP}$ is applied to an input of the fourth NAND gate $G_{14}$. The output of the first gate $G_{11}$ is applied to inputs of the third and fourth gates $G_{13}$ and $G_{14}$. $D_{11}$ and $D_{12}$ are delay elements. The delay element $D_{11}$ elongates the time interval of the second gate $G_{12}$ from the input state change to the output state change, compared to that of the first gate $G_{11}$. Similarly, the delay element $D_{12}$ elongates such time interval of the third gate $G_{13}$ with respect to that of the fourth gate $G_{14}$. The output $\overline{Q}$ of the fourth gate $G_{14}$ is coupled with the logical input of the first gate $G_{11}$ so that the circuit shown in FIG. 1 operates as a basic frequency dividing circuit, i.e., a binary counter, to produce outputs Q and $\overline{Q}$ having a frequency equal to half that of clock pulses CP and $\overline{CP}$.

It is permitted that the delay elements $D_{11}$ and $D_{12}$ provide the time delay only when the gate outputs change from a high level to a low level. In the case of a NOR gate, its time delay provision is necessary when NOR gate outputs change from a low level to a high level.

Figure 2:
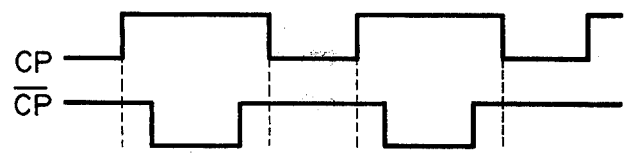
FIG. 2 shows exemplary waveforms of clock pulses to be used in the logic circuit according to the invention.

To ensure stable operation of the thus constructed frequency dividing circuit, it is necessary that the clock pulses CP and $\overline{CP}$ have no time interval that they are concurrently low in level as shown in FIG. 2.

Figure 3:
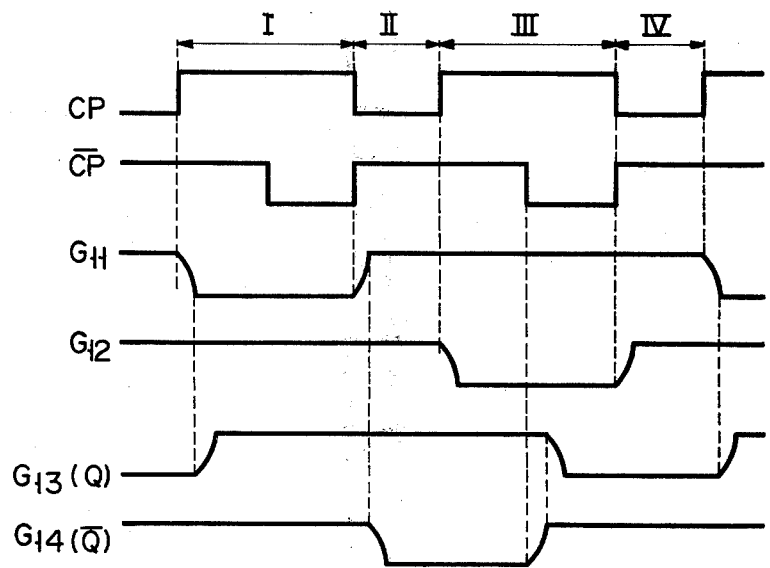
FIG. 3 shows a set of timing diagrams useful in explaining the operation of the logic circuit of FIG. 1.

A set of timing charts illustrating the operation of the circuit shown in FIG. 1 is shown in FIG. 3. In this example, the clock pulse CP has high level periods I and III of two times the duration of the low level periods II and IV. The output Q of the binary counter has high level periods two times the duration of low level periods, as in the case of the clock pulse CP. This relationship holds with the outputs of respective counter stages in a ripple counter in which a plurality of binary counters are connected in cascade fashion and the outputs of a stage counter are applied as clock pulses to the immediately succeeding stage binary counter. The relationship is very important particularly in a ripple counter in which currents fed to respective stages decrease in inverse proportion to the operating frequency for low power operation. In the integrated-injection logic gate, as the feeding current decreases, the propagation delay time increases. With the logic circuit of FIG. 1, the delay gates $G_{12}$ and $G_{13}$ and the gate $G_{14}$ must complete their output changes within the high level period III, as shown in FIG. 3. If the time interval III is longer than the low level time interval IV, the gate operation is allowed at a longer propagation delay time, as compared with the case the high level time interval III is equal to the low level time interval IV. It is for this reason that the binary counter as shown in FIG. 1 is suitable for low power operation.

Figure 4:
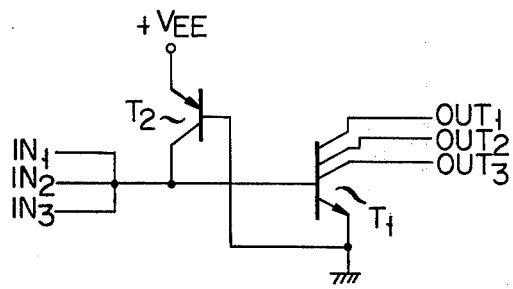
FIG. 4 shows an equivalent circuit of one form of $I^2L$ gates.
Figure 5:
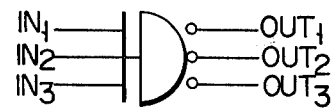
FIG. 5 is a logical symbol representing the gate of FIG. 4.

The logic circuit of the invention may preferably be constructed by using integrated-injection logic (I²L) gates which have been recently developed. As shown in the equivalent circuit in FIG. 4, the I²L gate includes a multiple-collector npn transistor $T_1$ and an injector pnp transistor $T_2$ of which the base and collector are connected to the emitter and the base of transistor $T_1$, respectively. The inverter transistor $T_1$ is of vertical structure and the injector transistor $T_2$ of lateral structure. Logic inputs $IN_1$, $IN_2$ and $IN_3$ are coupled with the base of transistor $T_1$. The multiple collectors provide outputs $OUT_1$, $OUT_2$ and $OUT_3$. The I²L gate as shown in FIG. 4 will be expressed by a symbol shown in FIG. 5, in this specification.

Figure 6:
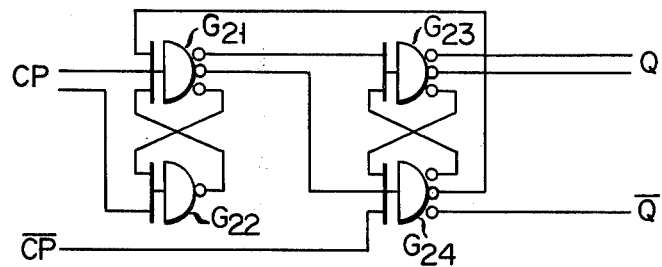
FIG. 6 shows the logic circuit of FIG. 1 expressed in terms of the logical symbol shown in FIG. 5.
Figure 7:
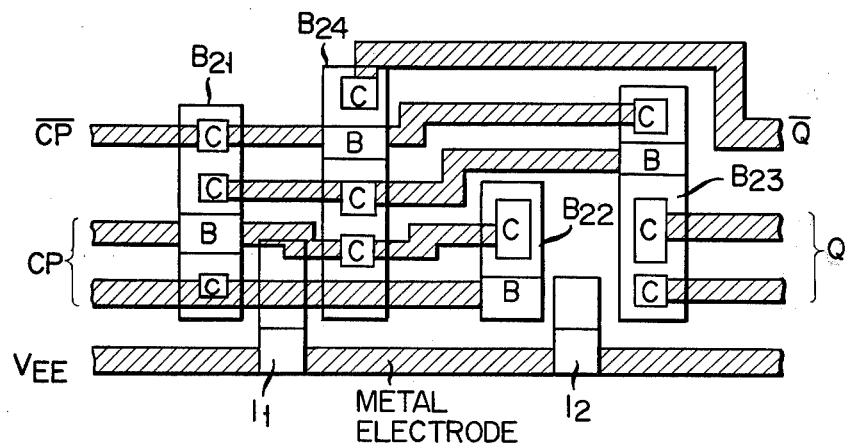
FIG. 7 is one form of pattern layout of the logic circuit of FIG. 6.

The logic circuit in FIG. 1 may be rewritten by using the I²L gate symbol as shown in FIG. 6. Gates $G_{21}$, $G_{22}$, $G_{23}$ and $G_{24}$ are I²L NAND gates corresponding to the gates $G_{11}$, $G_{12}$, $G_{13}$ and $G_{14}$, respectively. In FIG. 6, omitted are delay elements corresponding to the delay elements $D_{11}$ and $D_{12}$. The following is the reason for the omission of delay elements. The I²L gate has a property that as the injection current becomes larger, the propagation delay time becomes shorter. For this reason, if the injection current of each NAND gate $G_{21}$ and $G_{24}$ is twice as great as the current of the NAND gates $G_{22}$ and $G_{23}$, the time for the gates $G_{21}$ and $G_{24}$ to change the input potentials from a low level to a high level becomes approximately half of that of another couple of gates $G_{22}$ and $G_{23}$. In other words, the output variations of the gates $G_{22}$ and $G_{23}$ are more delayed than those of the gates $G_{21}$ and $G_{24}$, respectively, as in the case of use of the delay elements. That is, the provision of a proper difference of injector current between gates ensures a stable frequency dividing operation without delay elements.

A pattern layout of the logic circuit of FIG. 6 is schematically illustrated in FIG. 6. Here, reference characters $B_{21}$ to $B_{24}$ designate the base region of the inverters of the gates $G_{21}$ to $G_{24}$, respectively. In each base region, a collector region is formed and a collector electrode C further is formed thereon. The base electrode of each base region is designated by reference numeral B. $I_1$ represents an injector common to the base regions $B_{21}$ and $B_{24}$ and $I_2$ an injector common to the base regions $B_{22}$ and $B_{24}$.

Figure 8:
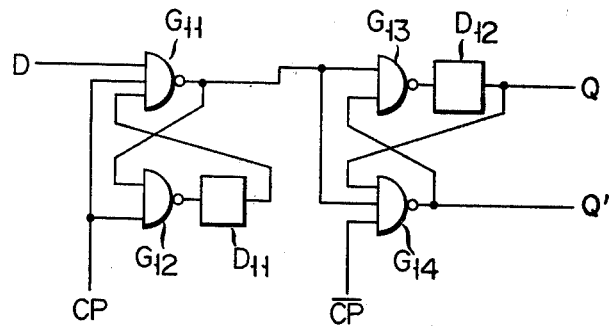
FIG. 8 shows a circuit diagram of another embodiment of the logic circuit according to the invention.
Figure 9:
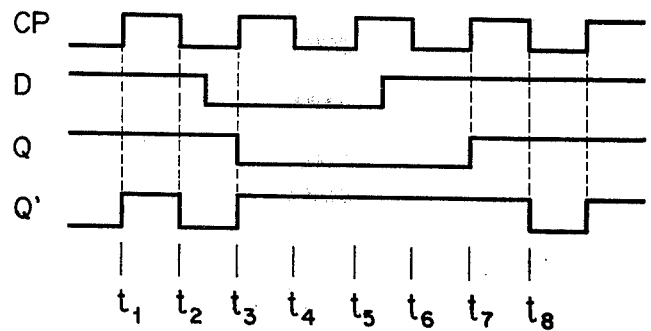
FIG. 9 shows a set of timing charts for illustrating the operation of the logic circuit of FIG. 8.
Figure 10:
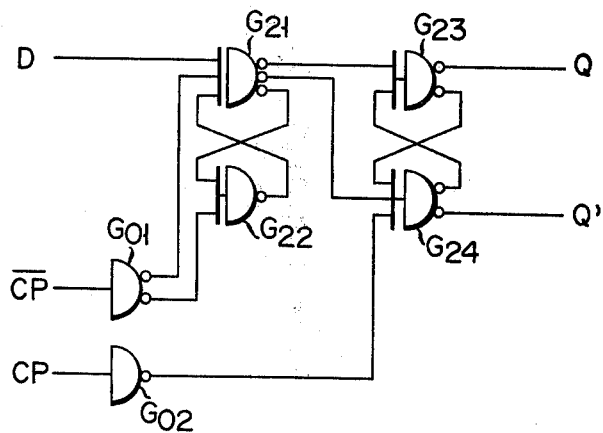
FIG. 10 is a circuit diagram of the embodiment of FIG. 8 depicted by using the logical symbol of $I^2L$ gates.

In the logic circuit of FIG. 1, the output of the gate $G_{14}$ is fed back to the input of the first gate $G_{11}$ for a binary counter arrangement. Alternatively, a separate logic input D, instead of the output of the gate $G_{14}$, may be employed, as shown in FIG. 8. A logic circuit shown in FIG. 8 executes the logic function similar to a type-D flip-flop circuit, as seen from a timing chart shown in FIG. 9. The FIG. 8 logic circuit using the I²L gates is as shown in FIG. 10. In FIG. 10, gates $G_{01}$ and $G_{02}$ are used to transfer clock pulses CP and $\overline{CP}$. As shown in FIG. 9, the outputs Q and Q' in the circuits FIGS. 8 and 10 are not complementary. To obtain complementary outputs Q and $\overline{Q}$, a latch circuit comprised of cross-coupled NAND gates $G_{25}$ and $G_{26}$ may be coupled with the outputs of the gates $G_{23}$ and $G_{24}$, as shown in FIG. 11.

FIG. 12 is another embodiment of the invention. In this embodiment, the clock pulse $\overline{CP}$ is applied to the third gate $G_{13}$ as well as the fourth gate $G_{14}$; and the output of the second NAND gate $G_{12}$ is applied to the fourth gate $G_{14}$. Further, the delay element for the third gate $G_{13}$ is omitted. This embodiment executes the logic operation as shown in FIG. 13.

Figure 14:
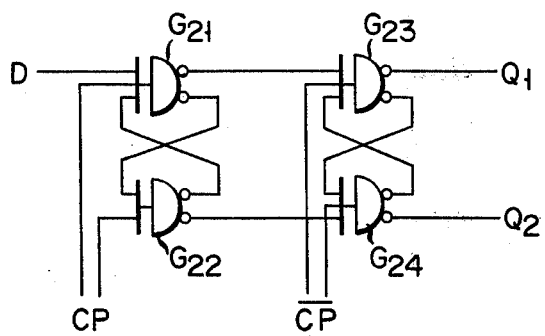
FIG. 14 is a circuit diagram of the FIG. 12 circuit depicted by using the logical symbol shown in FIG. 5.

The example of FIG. 12 may be rewritten into the circuit as shown in FIG. 14, by using the I²L NAND gates. When the I²L gates are used, the injection currents of the third and fourth NAND gates $G_{23}$ and $G_{24}$ may be equal. As in the previous embodiment, the injection current of the second gate $G_{22}$ is made smaller than that of the first gate $G_{11}$.

Figure 15:
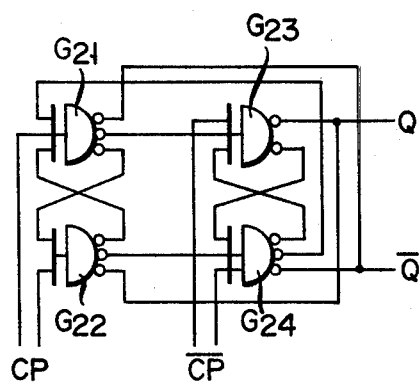
FIG. 15 shows a binary counter constructed by using the logic circuits shown in FIG. 14.

The embodiment of FIG. 14 is operable as a binary counter by coupling one output of the fourth NAND gate $G_{24}$ with the logic input of the first NAND gate $G_{21}$. Additionally, connections between the outputs of the first and fourth NAND gates $G_{21}$ and $G_{24}$ and of the second and third NAND gates $G_{22}$ and $G_{23}$ permit to produce complementary outputs $\overline{Q}$ and Q as shown in FIG. 15.

In the embodiment shown in FIGS. 12 and 14, the connection line between the gates $G_{11}$ and $G_{13}$ or between the gates $G_{21}$ and $G_{23}$ may be omitted by coupling a delay element to the third gate $G_{13}$ or by making the injection current of the gate $G_{23}$ smaller than that of the gate $G_{24}$. Alternatively, the connection line between the gates $G_{12}$ and $G_{14}$ or between the gates $G_{22}$ and $G_{24}$ may also be omitted by coupling a delay element to the gate $G_{14}$ or by making the injection current of the gate $G_{24}$ smaller than that of the gate $G_{23}$.

Figure 16:
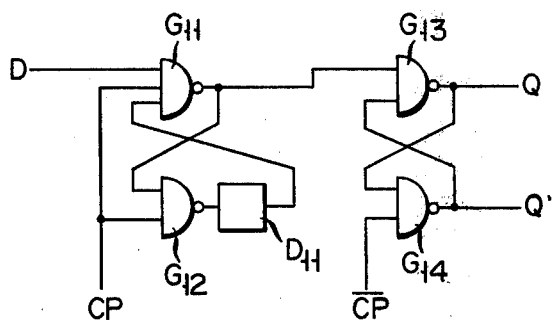
FIG. 16 is a circuit diagram of another embodiment of the logic circuit of the invention.
Figure 17:
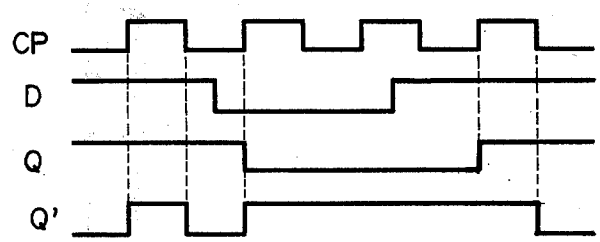
FIG. 17 shows a set of timing charts of the operation of the FIG. 16 circuit.
Figure 18:
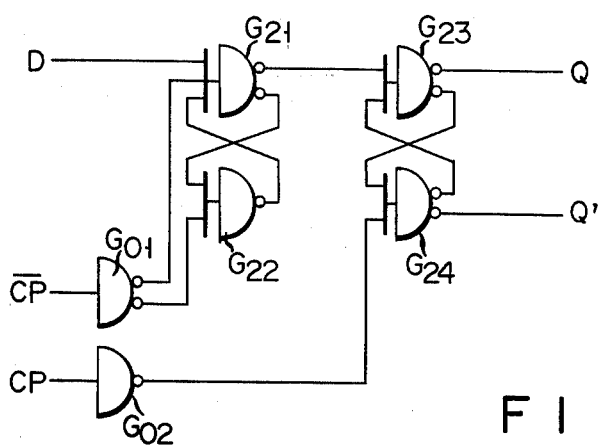
FIG. 18 is a circuit representation by the $I^2L$ gate symbol for the FIG. 16 circuit.
Figure 19:
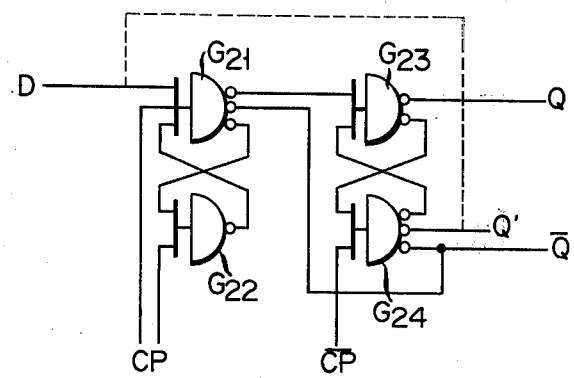
FIG. 19 shows a modification of the FIG. 18 circuit.

Another embodiment shown in FIG. 16 corresponds to the FIG. 8 embodiment of which the delay element $D_{12}$ and the connection line connecting the first gate $G_{11}$ to the fourth gate $G_{14}$ are omitted. The operation of the example is shown in FIG. 17. The circuit diagram depicted by using I²L gates $G_{21}$ to $G_{24}$ is further shown in FIG. 18. Connection of one output of the first gate $G_{21}$ to one output of the fourth gate $G_{24}$ as shown in FIG. 19 enables this example to produce complementary outputs Q an $\overline{Q}$. Additionally, if the output Q' of the fourth gate $G_{24}$ is connected to the logic input of the first gate $G_{21}$ as indicated by a dotted line in FIG. 19, the circuit operates as a binary counter. As in the case of FIG. 11, provision of the latch circuit including cross-coupled NAND gates with the outputs Q and Q' enables the FIG. 18 embodiment to produce complementary outputs.

Various kinds of synchronous counters may be constructed by using the above-mentioned logic circuits in such a manner, for example, that a plurality of the logic circuits are connected in cascade fashion with a proper feedback of the output of the succeeding stage or stages to the logic input of the first stage.

Figure 20:
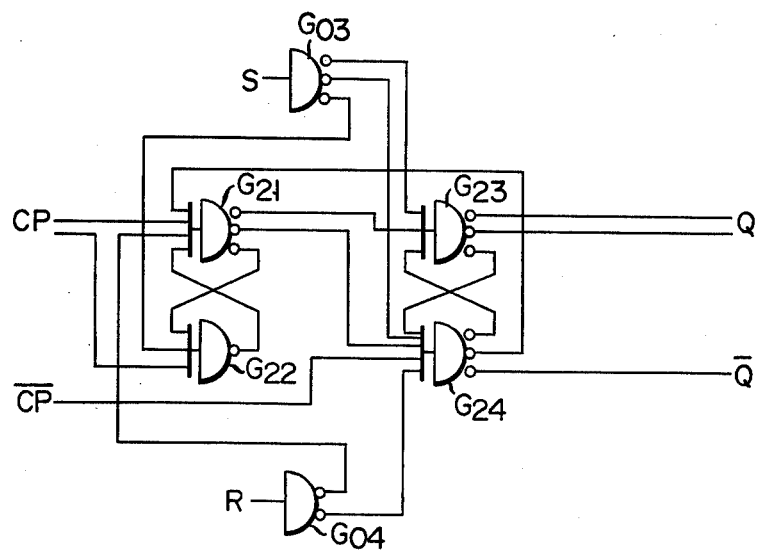
FIG. 20 is a circuit diagram of the logic circuits with set and reset functions according to the invention.

The embodiments thus far mentioned may be provided additionally with reset and/or set means to change the output state thereof. An example of such is shown in FIG. 20. The FIG. 20 example corresponds to the FIG. 6 example having additional set and reset means. A set signal is coupled with one input of the second gate $G_{22}$, one input of the third gate $G_{23}$ and one input of the fourth gate $G_{24}$, through a gate $G_{03}$. A reset signal R is fed to one input of the first gate $G_{21}$, and to one input of the fourth gate $G_{24}$, through a gate $G_{04}$.

What is claimed is:

1. A logic circuit comprising:
   first and second cross-coupled NAND/NOR gates, said second NAND/NOR gate having a delay of output change, due to an input change, which is larger than that of said first NAND/NOR gate;
   third and fourth cross-coupled NAND/NOR gates;
   means for coupling the output of said first NAND/NOR gate to respective inputs of said second and third NAND/NOR gates;
   means for coupling the delayed output of said second NAND/NOR gate to an input of said first NAND/NOR gate;
   means for supplying a first clock pulse to respective inputs of first and second NAND/NOR gates;
   means for supplying a second clock pulse having a phase substantially opposite to that of said first clock pulse to an input of at least said fourth NAND/NOR gate; and
   means for coupling a logic input signal to an input of said first NAND/NOR gate.

2. A logic circuit according to claim 1, in which said first, second, third and fourth NAND/NOR gates are integrated-injection logic gates, respectively.

3. A logic circuit according to claim 1, in which said third NAND/NOR gate has a delay of output change, due to an input change, larger than that of said fourth NAND/NOR gate, said logical input signal fed to the input of said first NAND/NOR gate is an output signal of said fourth NAND/NOR gate, and further comprising means coupling the output of said first NAND/NOR gate to an input of said fourth NAND/NOR gate.

4. A logic circuit according to claim 3, comprising a delay circuit coupled to the output of said third NAND/NOR gate for delaying the output thereof.

5. A logic circuit according to claim 4, comprising a delay circuit coupled to the output of said second NAND/NOR gate for delaying the output thereof.

6. A logic circuit according to claim 1, in which said third NAND/NOR gate has a delay of output change, due to an input change, larger than that of said fourth NAND/NOR gate, and further comprising means coupling the output of said first NAND/NOR gate to an input of said fourth NAND/NOR gate.

7. A logic circuit according to claim 1, in which an input of said third NAND/NOR gate is connected to receive said second clock pulse, and further comprising means coupling the output of said second NAND/NOR gate to an input of said fourth NAND/NOR gate.

8. A logic circuit according to claim 1, further comprising cross-coupled fifth and sixth gates respectively coupled with outputs of said third and fourth NAND/NOR gates.

9. A logic circuit according to claim 1, further comprising means coupling an output of said first NAND/NOR gate with an output of said fourth NAND/NOR gate.

10. A logic circuit according to claim 1, further comprising means for changing the output state of the logic circuit.

11. A logic circuit according to claim 10, wherein said means for changing the output state of the logic circuit is coupled to said third and fourth NAND/NR gates for changing the output stages of said third and fourth NAND/NOR gates.

12. A logic circuit according to claim 1, further comprising means coupling an output of said fourth NAND/NOR gate to an input of said first NAND/NOR gate as said logic input signal to said first NAND/NOR gate.

13. A logic circuit according to claim 1, comprising a delay circuit coupled to the output of said second NAND/NOR gate for delaying the output thereof.

* * * * *